United States Patent [19]

Weikel

[11] Patent Number: 4,862,074

[45] Date of Patent: Aug. 29, 1989

[54] POLYPHASE VOLT-HOUR INDICATING CIRCUIT

[75] Inventor: Scott J. Weikel, Raleigh, N.C.

[73] Assignee: Westinghouse Electric Corp., Pittsburgh, Pa.

[21] Appl. No.: 258,297

[22] Filed: Oct. 14, 1988

[51] Int. Cl.⁴ .................... G01R 1/00; G01R 21/06
[52] U.S. Cl. .................... 324/107; 324/111; 324/120; 324/142; 364/575; 364/811; 364/483
[58] Field of Search ............ 324/119, 142, 141, 111, 324/120, 107; 364/483, 492, 575, 734, 811; 328/142, 144; 307/490, 261

[56] References Cited

U.S. PATENT DOCUMENTS

| | | | |
|---|---|---|---|
| 4,110,834 | 8/1978 | Altwein | 364/811 |
| 4,182,983 | 1/1980 | Heinrich et al. | 324/142 |
| 4,596,951 | 4/1986 | Heinrich et al. | 324/74 |
| 4,743,843 | 5/1988 | Tada | 324/120 |

Primary Examiner—Reinhard J. Eisenzopf
Assistant Examiner—Vinh P. Nguyen
Attorney, Agent, or Firm—B. R. Studebaker

[57] ABSTRACT

An electronic circuit arrangement for producing an output signal representative of the average value of an alternating voltage in a power transmission system, composed of: at least one circuit unit composed of a pulse width modulator (6) connected to derive, from the alternating voltage, a train of pulses modulated in width as a function of the amplitude of the alternating voltage and with a defined phase relation to the alternating voltage, an electronic circuit (4,8) connected to derive, from the alternating voltage, an alternating signal which varies in frequency with the alternating voltage and which has the defined phase relation to the alternating voltage, and a signal multiplying device (14) connected to receive the train of pulses modulated in width and the alternating signal for multiplying the pulses and the alternating signal to produce a product signal having an amplitude proportional to the average magnitude of the alternating voltage; and a signal to frequency converter (16) connected to derive from the product signal a train of output pulses having a repetition rate proportional to the amplitude of the product signal and constituting the output signal (18).

6 Claims, 3 Drawing Sheets 4,862,074

1

POLYPHASE VOLT-HOUR INDICATING CIRCUIT

BACKGROUND OF THE INVENTION

The present invention relates to circuits for producing volt-hour readings for polyphase power systems.

It is common practice in the art to derive volt-hour (Vh) readings from the output of a volt-squared-hour ($V^2h$) meter, which requires a certain amount of data processing. At present, there are no electromechanical polyphase $V^2h$ or Vh meters.

Polyphase $V^2h$ metering would require three single phase $V^2h$ meters and an appropriate summing device.

While polyphase Vh and $V^2h$ meters presently exist, they are relatively expensive and are incapable of accepting low-level "electronic" inputs.

SUMMARY OF THE INVENTION

It is an object of the present invention to provide an inexpensive polyphase Vh meter circuit.

Another object of the invention is to provide a circuit of this type which is capable of acting on low-level electronic input signals.

Another object of the invention is to provide a polyphase volt-hour indicating circuit which can alternatively be used for single-phase power systems.

The above and other objects are achieved, according to the present invention, by an electronic circuit arrangement for producing an output signal representative of the average value of an alternating voltage in a power transmission system, comprising:

at least one circuit unit composed of pulse width modulator means connected to derive, from the alternating voltage, a train of pulses modulated in width as a function of the amplitude of the alternating voltage and with a defined phase relation to the alternating voltage, electronic circuit means connected to derive, from the alternating voltage, an alternating signal which varies in frequency with the alternating voltage and which has the defined phase relation to the alternating voltage, and signal multiplying means connected to receive the train of pulses modulated in width and the alternating signal for multiplying the pulses and the alternating signal to produce a product signal having an amplitude proportional to the average magnitude of the alternating voltage; and signal to frequency converter means connected to derive from the product signal a train of output pulses having a repetition rate proportional to the amplitude of the product signal and constituting the output signal.

DESCRIPTION OF THE PREFERRED EMBODIMENTS

Figure 1:
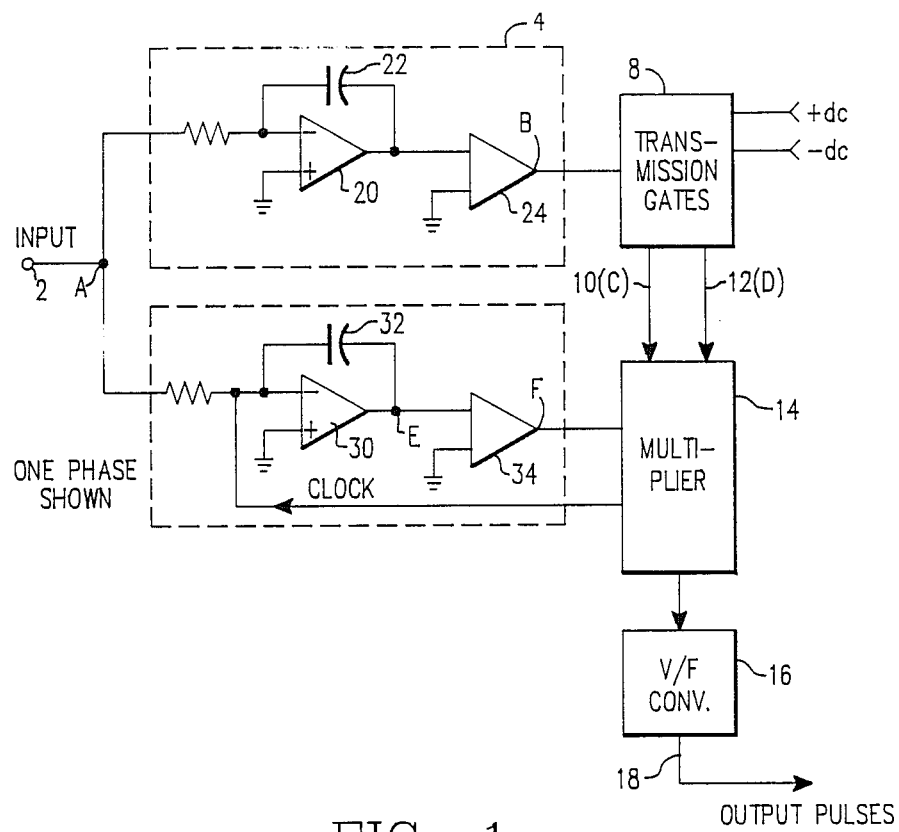
FIG. 1 is a block diagram of a preferred embodiment of a circuit according to the invention.

A preferred embodiment of a circuit according to the present invention is illustrated in FIG. 1 and includes an input terminal 2 connected to inputs of a square wave generator 4 and a pulse width modulator 6. Square wave generator 4 produces an output square wave having a pulse rate equal to the frequency of the signal applied to input terminal 2 and delayed in phase by 90°. relative to that input signal. Pulse width modulator 6 produces a train of output pulses modulated in width as a function of the amplitude of the signal applied to input terminal 2.

The output signal produced by square wave generator 4 is applied to the control input of a set of transmission gates 8 which are additionally supplied with positive and negative dc potentials having precisely fixed amplitudes. Gates 8 apply the dc potentials alternatingly and in phase opposition to outputs 10 and 12 under control of the square wave signal supplied by generator 4.

The output of pulse width modulator 6. and outputs 10 and 12 of gates 8 are supplied to a multiplying circuit 14 which produces a unidirectional output voltage proportional to the average value of the voltage applied to terminal 2. In effect, circuit 14 operates in a known manner to multiply the pulse width modulated signal portion representative of each positive half-wave of the signal at terminal 2 by a positive constant and to multiply the pulse width modulated signal portion representative of each negative half-wave of the signal at terminal 2 by a negative constant, the constant being represented by the dc potentials. A multiplying circuit of this type is disclosed, for example, in U.S. Pat. No. 4,596,951. The output voltage from circuit 14 is to the input of a voltage-to-frequency converter 16 to produce, at output terminal 18, a train of square wave pulses having a repetition rate which is directly proportional to the average amplitude value of the voltage applied to input terminal 2. Converter 16 could, for example, be constituted by a circuit as disclosed an illustrated in U.S. Pat. No. 4,182,983 and identified therein as circuit 60.

A volt-hour indication can be obtained simply by counting the output pulses at terminal 18 during a selected time interval.

Figure 2A:
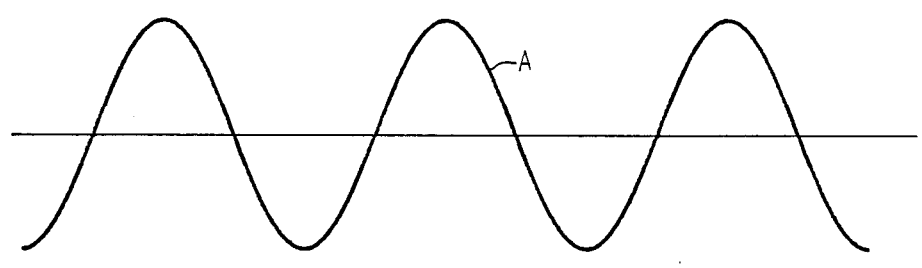
FIGS. 2A-2D and 3A-3D are signal wave form diagrams illustrating the operation of the circuit of FIG. 1.
Figure 2B:
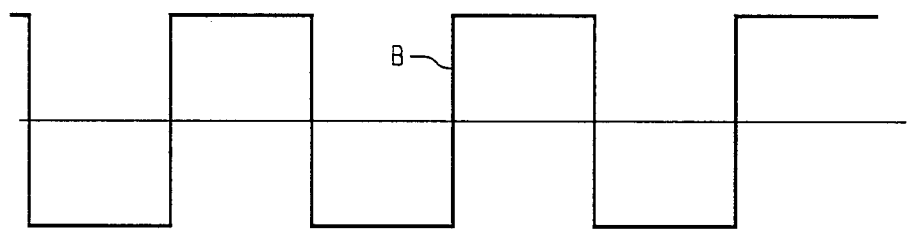

Square wave generator 4 is composed essentially of a differential amplifier 20 having its inverting input connected to input terminal 2 to receive input signal A, shown in FIG. 2a, and provided with a feedback connected capacitor 22 to function as an integrator. The output signal from differential amplifier 20 is applied to one input of a second differential amplifier 24 having its other input connected to ground and thus connected to function as a comparator. Amplifier 24 produces, at its output, a square wave signal B which, as shown FIG. 2b, differs in phase by 90° relative to signal A. It will be noted that the output signal from amplifier 20 is inverted by comparator 24.

Figure 2C:
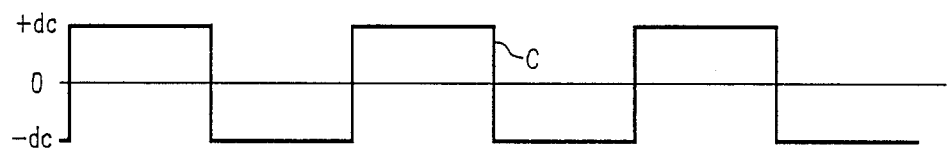
Figure 2D:
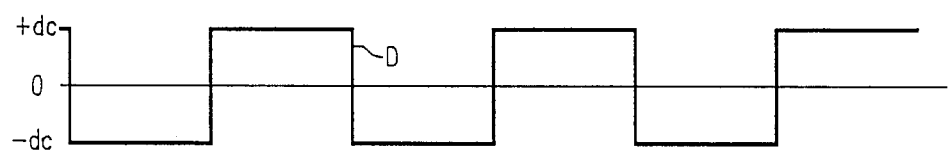

Signal B controls transmission gates 8 in such a manner as to produce, at outputs 10 and 12, square wave signals C and D as shown in FIGS. 2c and 2d, respectively.

Figure 3A:
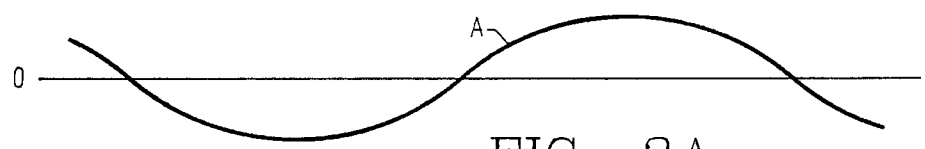
Figure 3B:
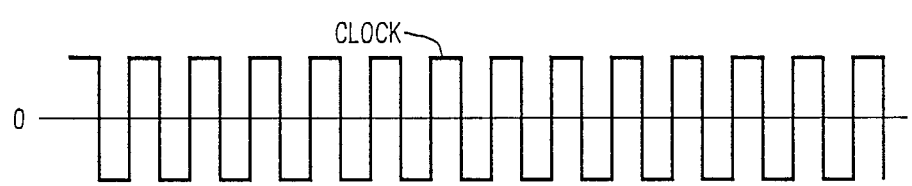

Reverting to FIG. 1, pulse width modulator 6 is constructed in a manner similar to square wave generator 4 in that modulator 6 is composed of a first differential amplifier 30 having its inverting input connected to input terminal 2 and provided with a feedback connected capacitor 32 to function as an integrator. However, the inverting input of amplifier 30 is additionally supplied with a square wave clock signal supplied by multiplying circuit 14, the clock signal having, as shown in FIG. 3b, a repetition rate which is several times the frequency of the voltage applied at input terminal 2.

Figure 3C:
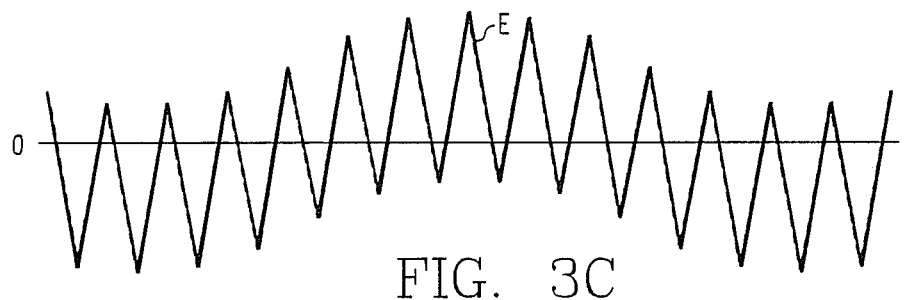
Figure 3D:
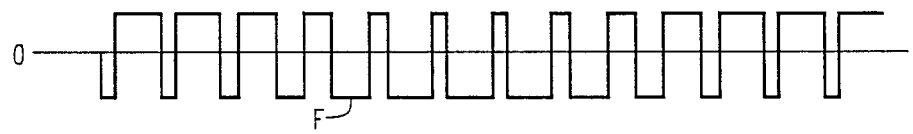

Thus, integrator 30, 32 produces a triangular output signal E, shown in FIG. 3c whose peak amplitude varies as a function of the change in amplitude of the voltage applied to input terminal 2 with a phase shift of 90°. The output signal E is applied to a second differential amplifier 34 which is connected to function as a comparator and which, because it has a very high gain and effects a polarity reversal, produces an output signal F constituted, as shown in FIG. 3d, by a train of square wave pulses modulated in width as a function of variations in amplitude, relative to ground, of the triangular signal E. FIG. 3a illustrates the voltage wave form applied to input terminal 2. All of FIGS. 3 relate to the same time scale, which is enlarged compared to the time scale of FIGS. 2.

As FIGS. 3 illustrate, the amplitude of each peak of triangular wave E relative to ground (0) is proportional to the instantaneous value of change of the voltage applied to input terminal A, with a phase shift of 90° or, in other terms, is proportional to the time integral of that voltage. Comparator 34 acts to produce the modulated pulse train F having an average repetition rate equal to that of the clock signal but composed of pulses which vary in width as a function of the peak amplitude of each cycle of triangular wave E.

Multiplying circuit 14 multiplies the pulse width modulated signal F produced by modulator 6 under control of the two pulse trains C and D provided by gates 8 and, with the aid of converter 16, derives from the product signal an output pulse train having a repetition rate proportional to the average amplitude value of the voltage applied at input terminal 2.

Figure 4:
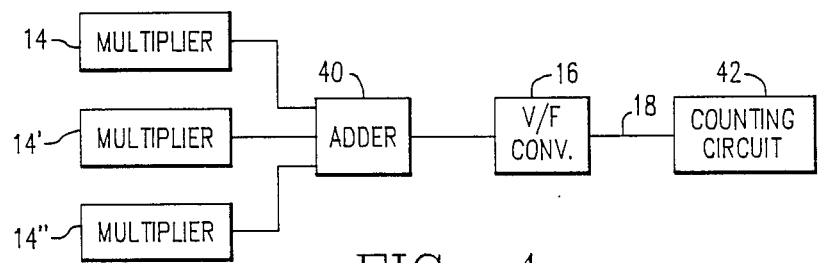
FIG. 4 is a block circuit diagram illustrating the application of the present invention to a three-phase voltage.

The circuit arrangement described thus far and illustrated in FIG. 1 will provide an output which can produce volt-hour indication for a single phase input signal. In order to produce a corresponding indication for a three-phase signal, a separate circuit unit can be provided for each signal phase, and as shown in FIG. 4, the output signals from multipliers 14, 14' and 14" of these three units can then be applied to a summing circuit 40, which can be an analog adder, producing an output voltage equal to the sum of the product voltages produced by the three multipliers 14, 14' and 14". The sum voltage provided by summing circuit 40 can then be applied directly to converter 16 so that the repetition rate of the output pulses appearing at terminal 18 will be representative of the sum of the three phase voltages.

Output terminal 18 can be connected to a suitable counting circuit 42, which may be of a known type, controlled to produce an output signal representative of the number of pulses appearing at terminal 18 during successive time intervals of fixed duration. The output signal from counting circuit 42 will thus provide a Vh indication. Circuit 42 could, of course, be connected to output terminal 18 of the circuit shown in FIG. 1.

In an exemplary circuit arrangement according to the invention for monitoring a 60 Hz power voltage, the period of the output pulses appearing at terminal 18 could vary about a center value of the order of 100 ms.

The illustrated circuit could be modified to provide an output signal proportional to the square of the input voltage, for use in deriving a V²h indication, by replacing square wave generator 4 and gates 8 by a suitable integrator and amplifier arrangement which will provide an output voltage proportional in amplitude to the voltage applied to terminal 2 and having the correct phase position relative to pulse width modulated signal F.

While the description above shows particular embodiments of the present invention, it will be understood that many modifications may be made without departing from the spirit thereof. The pending claims are intended to cover such modifications as would fall within the true scope and spirit of the present invention.

The presently disclosed embodiments are therefore to be considered in all respects as illustrative and not restrictive, the scope of the invention being indicated by the appended claims, rather than the foregoing description, and all changes which come within the meaning and range of equivalency of the claims are therefore intended to be embraced therein.

What is claimed:

1. An electronic circuit arrangement for producing an output signal representative of the average value of an alternating voltage in a power transmission system, comprising:
   at least one circuit unit composed of pulse width modulator means connected to derive, from the alternating voltage, a train of pulses modulated in width as a function of the amplitude of the alternating voltage and with a defined phase relation to the alternating voltage, electronic circuit means connected to derive, from the alternating voltage, an alternating signal which varies in frequency with the alternating voltage and which has the defined phase relation to the alternating voltage, and signal multiplying means connected to receive the train of pulses modulated in width and the alternating signal for multiplying the pulses and the alternating signal to produce a product signal having an amplitude proportional to the average magnitude of the alternating voltage; and
   signal to frequency converter means connected to derive from the product signal a train of output pulses having a repetition rate proportional to the amplitude of the product signal and constituting the output signal.

2. A circuit arrangement as defined in claim further comprising pulse counting means connected to count the train of output pulses produced by said converter means during successive time intervals of fixed duration.

3. A circuit arrangement as defined in claim 2 for producing an output signal representative of the sum of the alternating voltages in a plural phase power transmission system, wherein there is a plurality of said
   circuit units each connected to receive a respective phase voltage, and further comprising summing means connected to receive the product signals produced by all of said circuit units to produce a sum signal proportional to the sum of the product signals and to supply the sum signal as the input to said converter means.

4. A circuit arrangement as defined in claim 1 for producing an output signal representative of the sum of the alternating voltages in a plural phase power transmission system, wherein there is a plurality of said circuit units each connected to receive a respective phase voltage, and further comprising summing means connected to receive the product signals produced by all of said circuit units to produce a sum signal proportional to the sum of the product signals and to supply the sum signal as the input to said converter means.

5. A circuit arrangement as defined in claim 4 wherein said electronic circuit means comprise a square wave generator for producing a square wave signal as the alternating signal, and transmission gate means having inputs connected to receive positive and negative dc potentials having defined amplitudes and to receive the alternating signal and having two outputs to which the dc potentials are applied in alternation under control of the alternating signal, with the potential at one output being in polarity opposition to the potential at the other output and with both of said outputs being connected to said multiplying means.

6. A circuit arrangement as defined in claim 1 wherein said electronic circuit means comprise a square wave generator for producing a square wave signal as the alternating signal, and transmission gate means having inputs connected to receive positive and negative dc potentials having defined amplitudes and to receive the alternating signal and having two outputs to which the dc potentials are applied in alternation under control of the alternating signal, with the potential at one output being in polarity opposition to the potential at the other output and with both of said outputs being connected to said multiplying means.

* * * * *